(12) United States Patent
Simin et al.

(10) Patent No.: US 8,643,430 B2
(45) Date of Patent: Feb. 4, 2014

(54) DEVICE AND CIRCUIT WITH IMPROVED LINEARITY

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 65 days.

(21) Appl. No.: 13/311,633

(22) Filed: Dec. 6, 2011

(65) Prior Publication Data

US 2012/0139625 A1 Jun. 7, 2012

Related U.S. Application Data

(60) Provisional application No. 61/419,923, filed on Dec. 6, 2010.

(51) Int. Cl.
  *H03B 1/00* (2006.01)
(52) U.S. Cl.
  USPC .......................................................... 327/551
(58) Field of Classification Search
  USPC .......... 327/346, 350, 351, 352, 551, 560, 583
  See application file for complete search history.

(56) References Cited

U.S. PATENT DOCUMENTS

| | | | | |
|---|---|---|---|---|
| 5,418,637 A | * | 5/1995 | Kuo | 398/159 |
| 5,523,716 A | * | 6/1996 | Grebliunas et al. | 330/149 |
| 5,703,530 A | * | 12/1997 | Sato et al. | 330/149 |
| 6,288,814 B1 | * | 9/2001 | Blauvelt | 398/193 |
| 6,946,895 B2 | * | 9/2005 | Umeda et al. | 327/359 |
| 7,332,961 B2 | * | 2/2008 | Blednov | 330/149 |
| 7,852,153 B1 | * | 12/2010 | Ellis et al. | 330/133 |

OTHER PUBLICATIONS

Ken Kundert, Accurate and Rapid Measurement of IP2 and IP3, Version 1b, May 22, 2002, The Designer's Guide Community, www.designers-guide.org, 13 pages.
Robert H. Caverly et al., On-State Distortion in High Electron Mobility Transistor Microwave and RF Switch Control Circuits, IEEE Transactions on Microwave Theory and Techniques, vol. 48, No. 1, Jan. 2000, pp. 98-103.
Jianyu Deng et al., Insertion loss and linearity of III-nitride microwave switches, Phys. Status Solidi C7, No. 10, 2010, pp. 2423-2425.

* cited by examiner

*Primary Examiner* — Jeffrey Zweizig
(74) *Attorney, Agent, or Firm* — LaBatt, LLC

(57) ABSTRACT

A solution for compensating intermodulation distortion of a component is provided. A circuit element includes multiple connected components. At least two of the connected components comprise current-voltage characteristics of opposite signs (e.g., sublinear and superlinear current-voltage characteristics) such that the current-voltage characteristics of the circuit element produces a level of intermodulation distortion for the circuit element lower than a level of intermodulation distortion for each of the connected components.

20 Claims, 8 Drawing Sheets

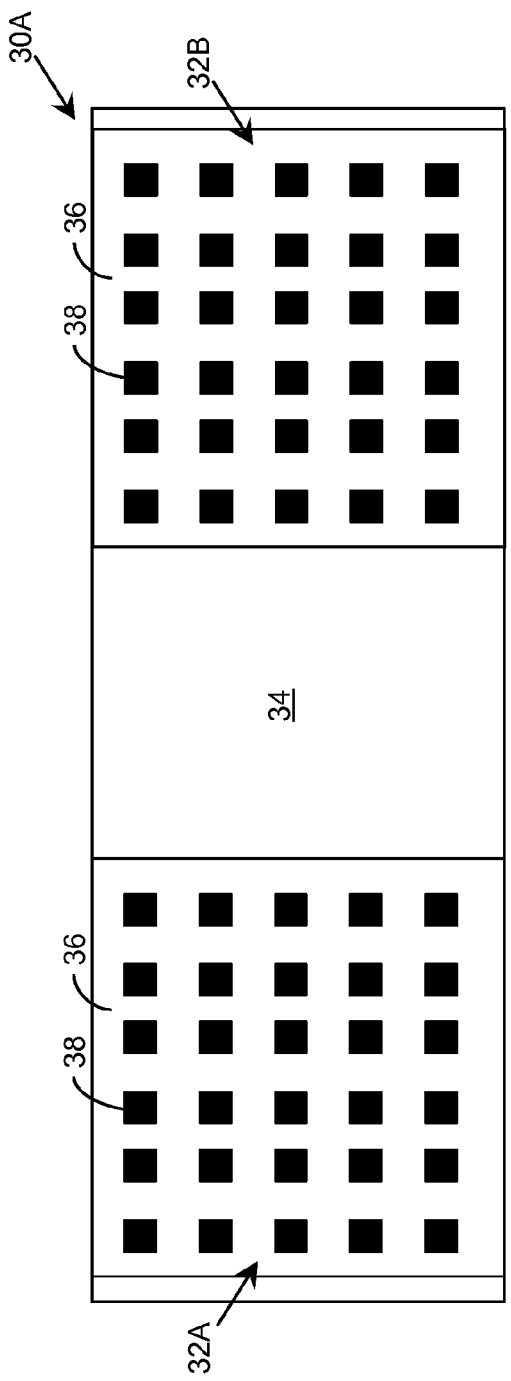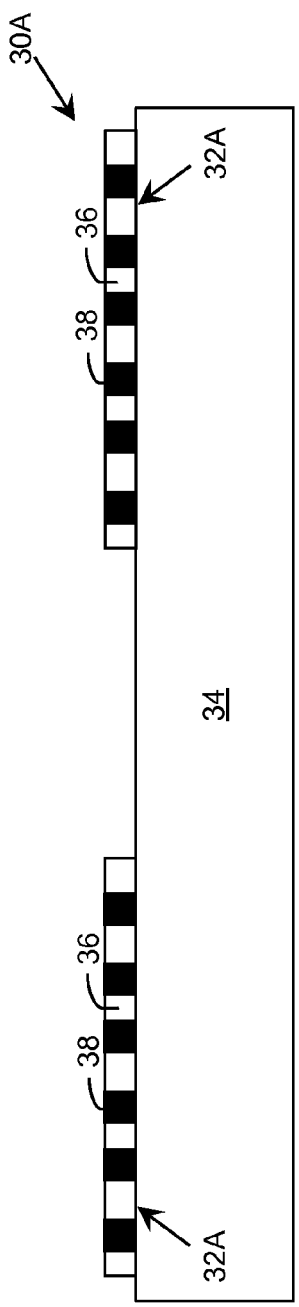

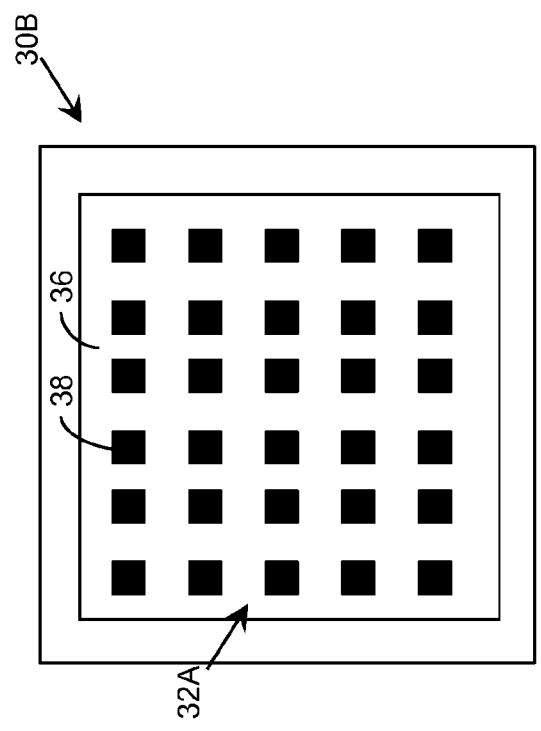
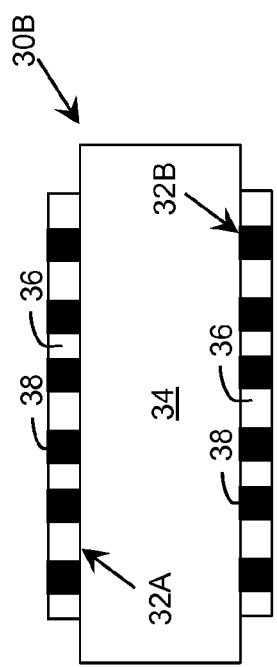

DEVICE AND CIRCUIT WITH IMPROVED LINEARITY

REFERENCE TO RELATED APPLICATION

The current application claims the benefit of U.S. Provisional Application No. 61/419,923, titled "Device and circuit with improved linearity," which was filed on 6 Dec. 2010, and which is hereby incorporated by reference.

TECHNICAL FIELD

The disclosure relates generally to semiconductor devices and the corresponding circuits, and more particularly, to a solution for reducing an amount of intermodulation distortions in such devices and circuits.

BACKGROUND ART

Modern communication systems seek components having a high linearity in order to reduce intermodulation distortions. Intermodulation distortion can adversely affect the operation of multichannel systems utilizing closely spaced channel frequencies, f1, f2, f3, etc. When the current (I) voltage (V) characteristics of all the circuit components are perfectly linear, e.g., $I=\alpha_1 \times V$, where $\alpha_1$ is a constant coefficient, no frequency transformation and mixing occurs in the circuit. However, when some of the components have a nonlinear I-V relationship, intermodulation products appear in some or all of the signal channels. One of the most adverse types of intermodulation distortion are the third order distortions, which generate intermodulation products at frequencies corresponding to $2 \times f1 \pm f2$, $2 \times f2 \pm f1$, $2 \times f2 \pm f3$, etc. When the channel frequency separation is small, the third order intermodulation products generate signals within the channel frequencies, f1, f2, f3, etc., thereby creating intermodulation distortions.

The I-V nonlinearity responsible for the third order distortion comes from a term proportional to $V^3$. In particular, when the actual I-V characteristic is approximated by the polynomial expression $I=\alpha_1 \times V+\alpha_2 \times V^2+\alpha_3 \times V^3+\ldots$, the $\alpha_3$ coefficient gives rise to the third order intermodulation distortions. Frequently, a level of third order intermodulation distortion can be characterized by calculating the third order intercept point (IP3). IP3 corresponds to a fictitious extrapolated input power level at which the power at a fundamental frequency equals the power at an intermodulation frequency (e.g., $2 \times f1 \pm f2$). For a single element, IP3 in dBm can be calculated by:

$$IP3 = 10 \times \log 10[4 \times \alpha_1^3/(3 \times \alpha_3) \times 10^3].$$

A more practical expression for the magnitude of IP3 comes from considering a nonlinear component connected into a circuit. FIG. 1 shows a simple illustrative circuit 2 comprising a nonlinear component 4 having an impedance Z connected in series between a signal source having the voltage $V_S$ and internal impedance $Z_0$ according to the prior art. Typical examples of circuits including such a connection include microwave switches, attenuators, power limiters, etc., connected into a radio frequency (RF) or microwave transmission line. For the circuit 2, the $IP_3$ in dBm can be calculated by the expression:

$$IP_3 = 10 \times \log 10 \left[ \frac{Z_0 \alpha_1^3}{2\alpha_3}(1+2Z_0\alpha_1) \times 10^3 \right] \tag{1}$$

SUMMARY OF THE INVENTION

Aspects of the invention provide a solution for compensating intermodulation distortion of a component. A circuit element includes multiple connected components. At least two of the connected components comprise current-voltage characteristics of opposite signs (e.g., sublinear and superlinear current-voltage characteristics) such that the current-voltage characteristics of the circuit element produces a level of intermodulation distortion for the circuit element lower than a level of intermodulation distortion for each of the connected components.

A first aspect of the invention provides a circuit element comprising: a plurality of connected components, the plurality of connected components including: at least one sublinear connected component, each of the at least one sublinear connected component having sublinear current-voltage characteristics; and at least one superlinear connected component, each of the at least one superlinear connected component having superlinear current-voltage characteristics, wherein the plurality of connected components are connected such that the current-voltage characteristics of the circuit element produces a level of intermodulation distortion for the circuit element lower than a level of intermodulation distortion for each of the plurality of connected components.

A second aspect of the invention provides a circuit comprising: at least one circuit element comprising: a plurality of connected components, the plurality of connected components including: at least one sublinear connected component, each of the at least one sublinear connected component having sublinear current-voltage characteristics; and at least one superlinear connected component, each of the at least one superlinear connected component having superlinear current-voltage characteristics, wherein the plurality of connected components are connected such that the current-voltage characteristics of the circuit element produces a level of intermodulation distortion for the circuit element lower than a level of intermodulation distortion for each of the plurality of connected components; a source electrically connected to an input of the at least one circuit element; and a load electrically connected to an output of the at least one circuit element.

A third aspect of the invention provides a circuit comprising: a first circuit element comprising: an active component; and a controllable circuit component connected to the active component, wherein the controllable circuit component has a variable and controllable nonlinearity; a linearity measurement component connected to an output of the first circuit element, wherein the linearity measurement component is configured to generate data corresponding to a linearity measurement of the first circuit element; and a control component connected to an output of the linearity measurement component and the controllable circuit component, wherein the control component is configured to generate a set of control signals to adjust the nonlinearity of the controllable circuit component based on data received from the linearity measurement component and a target level of linearity for the first circuit element.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 6A and 6B show top and cross section views, respectively, of an illustrative planar device having monolithically integrated nonlinearity compensating contacts according to an embodiment.

FIGS. 7A and 7B show top and cross section views, respectively of an illustrative vertical device having monolithically integrated nonlinearity compensating contacts according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a solution for compensating intermodulation distortion of a component. A circuit element includes multiple connected components. At least two of the connected components comprise current-voltage characteristics of opposite signs (e.g., sublinear and superlinear current-voltage characteristics) such that the current-voltage characteristics of the circuit element produces a level of intermodulation distortion for the circuit element lower than a level of intermodulation distortion for each of the connected components. To this extent, the solution can reduce the intermodulation distortions in devices and circuits, such as semiconductor devices and radio frequency devices and circuits, e.g., as part of a communications system. While illustrative aspects are shown and described herein with reference to third order distortions, it is understood that aspects of the invention can be applied to compensate other order distortions, such as second order distortions. As used herein, unless otherwise noted, the term "set" means one or more (i.e., at least one) and the phrase "any solution" means any now known or later developed solution.

Figure 2B:
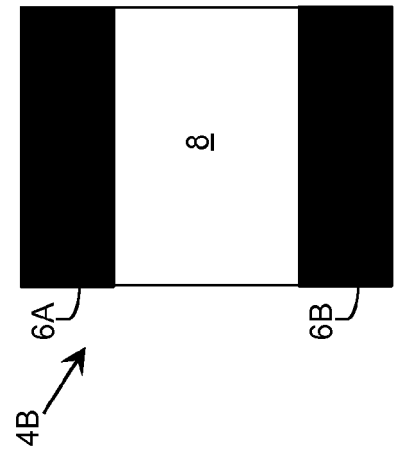
FIGS. 2A and 2B show illustrative device layouts according to the prior art.
Figure 2A:
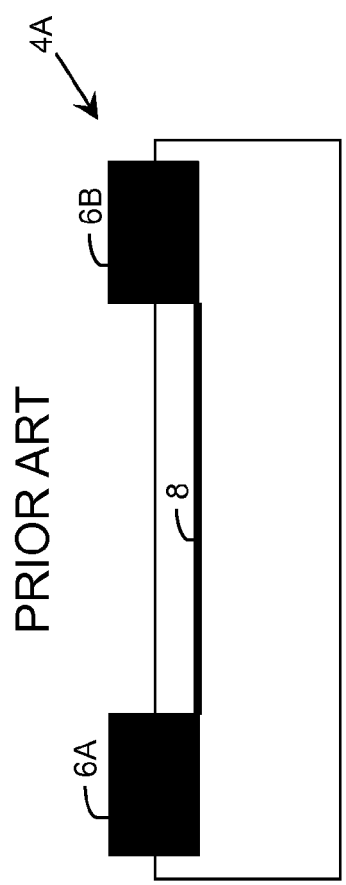

Turning to the drawings, FIGS. 2A and 2B show illustrative device layouts according to the prior art. FIG. 2A shows an illustrative lateral, or planar, device 4A, while FIG. 2B shows an illustrative vertical device 4B. In both devices 4A, 4B, a pair of contacts 6A, 6B are located on opposing sides of a device channel 8 extending there between. When implemented in a circuit, a contact, such as contact 6A, comprises an input contact through which current enters the device 4A, 4B, and another contact, such as contact 6B, comprises an output contact through which current exits the device 4A, 4B after traveling along the device channel 8. It is understood that the term device channel 8 refers to a region of the device 4A, 4B responsible for its functionality.

Figure 3:
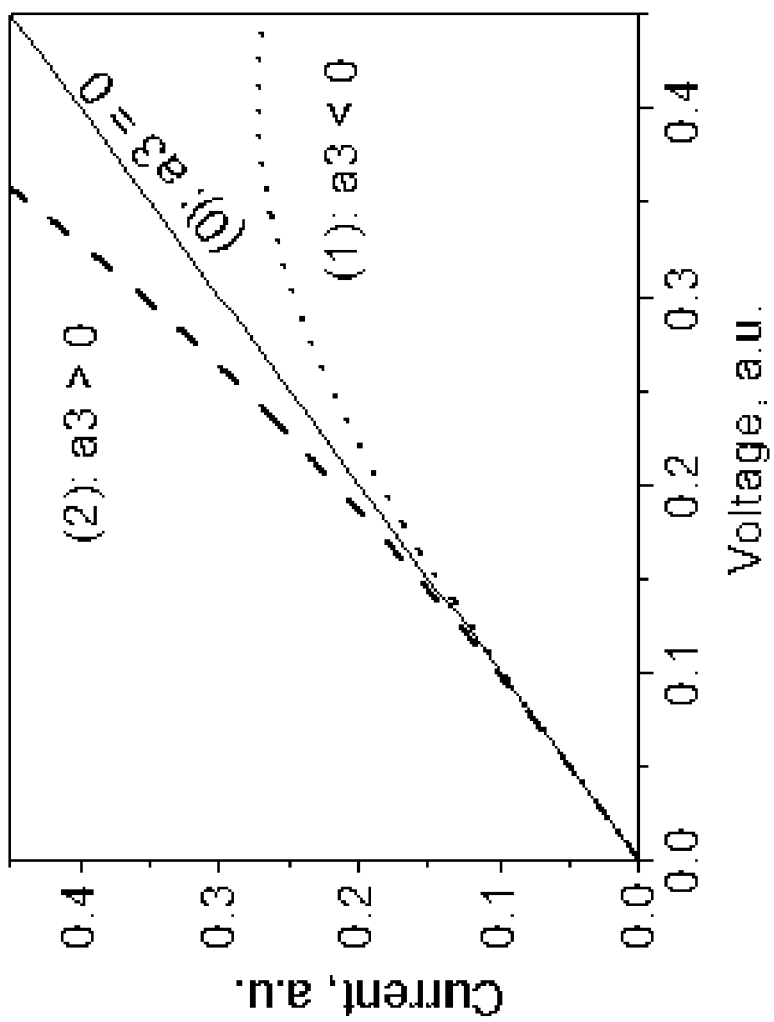
FIG. 3 shows illustrative current-voltage characteristics according to an embodiment.

Each of the components of the device 4A, 4B, the contacts 6A, 6B and the device channel 8, can have nonlinear current-voltage (I-V) characteristics, thereby giving rise to intermodulation distortions. FIG. 3 shows illustrative current-voltage characteristics according to an embodiment. In particular, lines (1) and (2) correspond to negative and positive third-order polynomial coefficients, $\alpha 3$, respectively, while line (0) corresponds to $\alpha 3=0$. The most common nonlinearity associated with the semiconductor device channel 8 is illustrated by line (1). This type of nonlinearity can be caused by: mobility-electric field dependence, heating effects, surface potential, the presence of a gate electrode between contacts 6A, 6B, and/or the like. In an embodiment, the I-V characteristics for a device channel 8 can be approximated using the polynomial: $I=\alpha 1 \times V + \alpha 3 \times V^3$. In this case, the $\alpha 2$ term is omitted from the I-V approximation since it does not contribute to the third order intermodulation distortions, and higher terms can be omitted since their effect on IP3 is minor.

Figure 1:
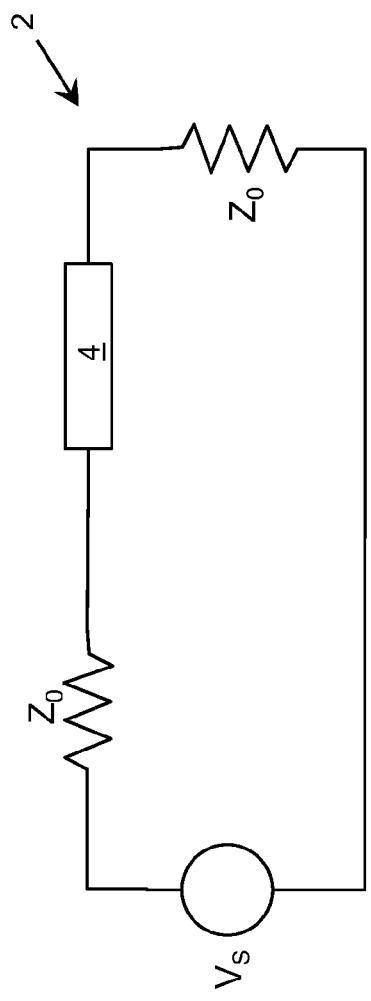
FIG. 1 shows a simple illustrative circuit according to the prior art.

In an illustrative example, the circuit 2 of FIG. 1 can comprise a device 4 connected between a source and a load having characteristic impedances, $Z_0$, of 50 Ohms each. Additionally, the device 4 can comprise a device channel 8, where $\alpha 1=1$ and $\alpha 3=-0.002$. Using the expression (1), the IP3 point for the circuit 2 including the device 4, $IP3_{CH}$, can be calculated as $IP3_{CH}=64$ dBm.

Figure 4:
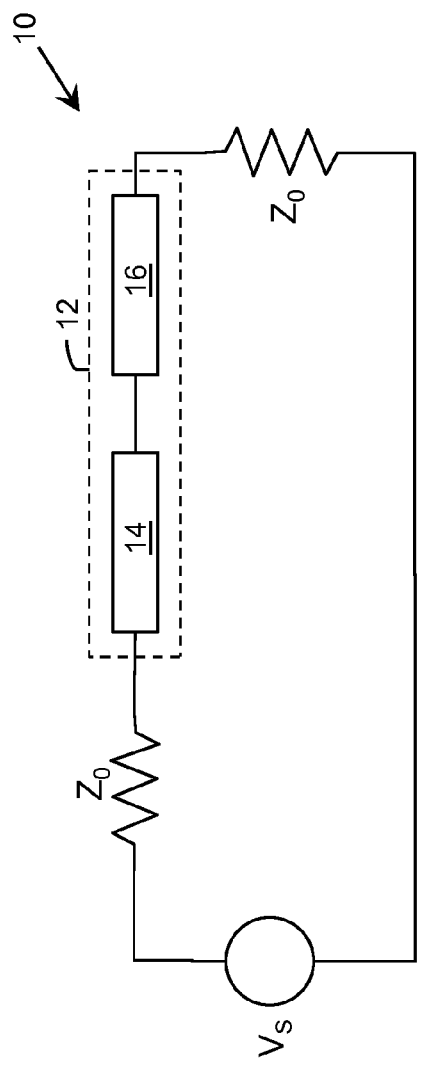
FIG. 4 shows an illustrative circuit according to an embodiment.

FIG. 4 shows an illustrative circuit 10 according to an embodiment. The circuit 10 includes a circuit element 12 comprising a first component 14 and a second component 16 connected in series with the first component 14. The components 14, 16 can comprise $\alpha 3$ coefficients having opposite signs of one another, such that one component can compensate the nonlinearity due to the other component. To this extent, one component, such as the first component 14, can comprise a sublinear component having a sublinear current-voltage characteristic (e.g., a negative $\alpha 3$ coefficient) as shown by line (1) in FIG. 3. The other component, such as the second component 16, can comprise a superlinear component having a superlinear current-voltage characteristic (e.g., a positive $\alpha 3$ coefficient) as shown by line (2) in FIG. 3. Furthermore, one component can comprise an active component, which is selected and configured to perform a desired function for the circuit 10, while the other component can comprise a nonlinearity compensating component, which is selected and configured to compensate the nonlinear I-V characteristics of the active component.

When the values of the $\alpha 3$ coefficients of the components 14, 16 are substantially equal in magnitude with opposite signs, the circuit element 12 comprising the series connection of the two components 14, 16 provides an I-V characteristic substantially equal to the I-V characteristics with a zero $\alpha 3$ coefficient as shown by line (0) in FIG. 3. To this extent, the circuit element 12 (e.g., a composite device) including the components 14, 16 can have a much lower $\alpha 3$ coefficient, and therefore a much higher IP3 point as compared to a similar device without a compensating component. When the $\alpha 3$ coefficients have sufficiently close magnitudes, the circuit element 12 will produce a lower level of intermodulation distortions than that of either of the individual corresponding components 14, 16 alone.

In an illustrative configuration, the first component 14 can have I-V characteristics given by $I=\alpha 1 \times V + \alpha 3 \times V^3$, where $\alpha 1=1$ and $\alpha 3=-0.002$, and the second component 16 can have I-V characteristics given by $I=\alpha 1 \times V+\alpha 3 \times V^3$, where $\alpha 1=1$ and $\alpha 3=0.00199$. Simulations of these parameters indicate the I-V characteristics of the series connection of the components 14, 16 is given by $I=\alpha 1 \times V+\alpha 3 \times V^3$, where $\alpha 1=0.5$ and $\alpha 3=7.88E-15$. Using the expression (1), the IP3 point can be calculated as IP3=193 dBm. As illustrated, the inclusion of a compensating component provides a substantial increase in the IP3 values, which well exceeds any practical values demonstrated to date.

Figure 5A:
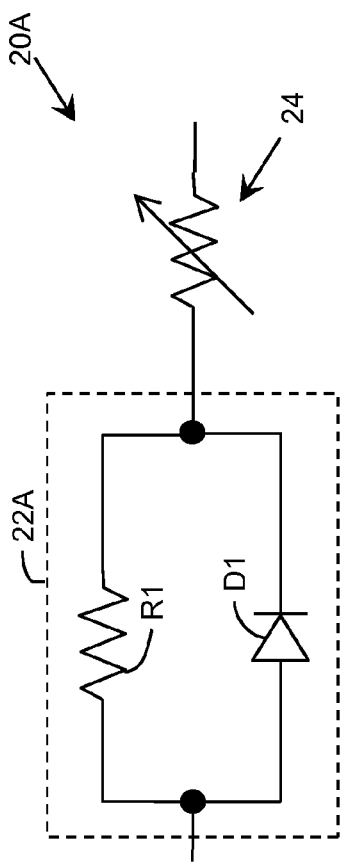
FIGS. 5A-5C show illustrative schematics of elements with nonlinearity compensating component(s) according to embodiments.
Figure 5B:
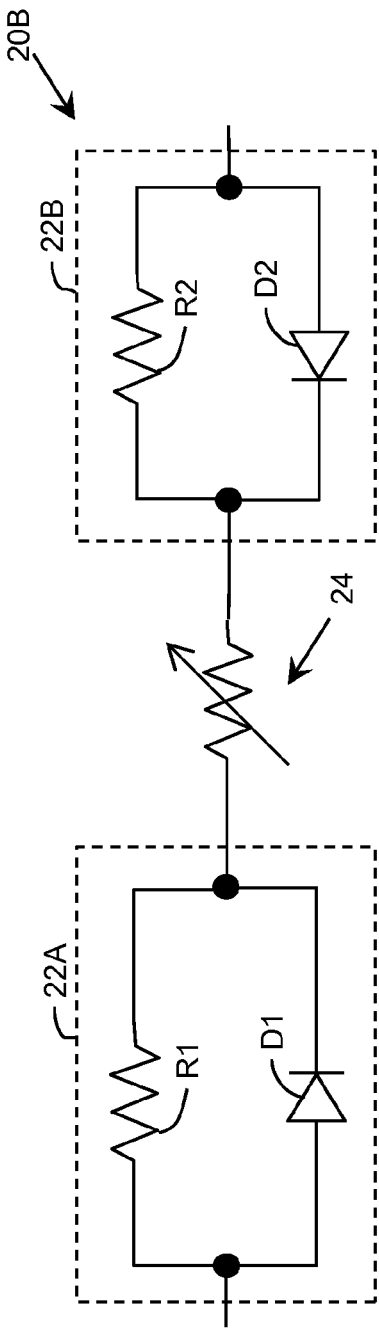
Figure 5C:
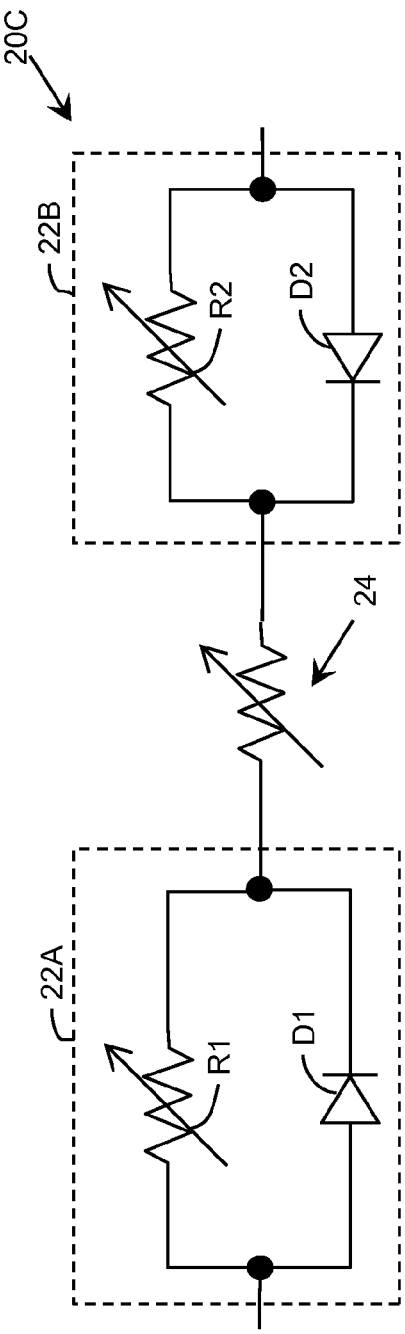

FIGS. 5A-5C show illustrative schematics of elements 20A-20C with nonlinearity compensating component(s) 22A, 22B according to embodiments. In FIG. 5A, the element 20A includes a single nonlinearity compensating component 22A connected in series with an active component 24 having nonlinear I-V characteristics. In FIGS. 5B and 5C, the elements 20B, 20C include a pair of nonlinearity compensating components 22A, 22B connected in series with the active component 24. In an embodiment, a compensating component 22A, 22B can comprise a parallel connection of a diode D1, D2 and a shunt resistor R1, R2. Resistors R1, R2 can comprise linear resistors, or as illustrated in FIG. 5C, a compensating component 22A, 22B can comprise a variable resistor R1, R2. A diode D1, D2 can have exponential I-V characteristics and can comprise a Schottky diode, a p-n junction diode, a heterostructure diode, and/or the like. When multiple compensating components 22A, 22B are included, the diodes D1, D2 can be connected in opposite directions to each other, which ensures symmetrical $\alpha 1$ and $\alpha 3$ values for an element 20B, 20C operating in an alternating current (AC) circuit.

As discussed herein, a compensating component 22A, 22B can have an opposite sign for the $\alpha 3$ coefficient to that of the active component 24. The I-V characteristics of the diode D1, D2 can be calculated by: $I_D=I_S \times \exp(V/0.026)$, where $I_S$ is the reverse bias saturation current, while the I-V characteristics of the resistor R1, R2 can be calculated by: $I_R=G \times V$, where G is the conductance of the resistor R1, R2. In an embodiment, the active component 24 comprises a channel of the element 20A-20C.

Referring to FIG. 5A as an illustrative example, the active component 24 can comprise a device channel where $\alpha 1=1$ and $\alpha 3=-0.00199$. The diode D1 and resistor R1 of the compensating component 22A can be selected such that $I_S=4.45E-9$ and $G=12E3$. In this case, simulations indicate the I-V characteristics of a compensating component 22A (e.g., the parallel connection of the diode D1 and the resistor R1) can be approximated as $I=\alpha 1 \times V+\alpha 3 \times V^3$, where $\alpha 1=1.002$ and $\alpha 3=0.00211$. Further simulations indicate the element 20A including the series connection of the compensating component 22A and the active component 24 has an $\alpha 3$ coefficient of $\alpha 3=1.26E-4$, which is twenty times lower than that of the active component 24 without the compensating component 22A. Furthermore, the corresponding IP3=91 dBm, which is a 27 dBm increase compared to the IP3 of a device without the compensating component 22A.

It is understood that the $\alpha 3$ coefficient can be further decreased by fine tuning the resistor value, the diode $I_S$ parameter, and/or other diode parameters, which will result in a corresponding increase for the IP3. For example, in the example above, changing the conductance of the resistor R1 to $G=11E3$, results in a compensated $\alpha 3$ coefficient value of $\alpha 3=1.33E-5$. The corresponding IP3=100.8 dBm, which is approximately a 36 dBm improvement compared to the IP3 of an uncompensated device. Similarly, a value of the maximum diode current for the diode D1 can be adjusted to make the absolute value of the $\alpha 3$ coefficient of the compensating component 22A the same or close to the absolute value of the active component 24.

The various elements 20A-20C can be manufactured using any solution. For example, the diode(s) D1, D2 and resistor(s) R1, R2 can comprise external components, which are electrically connected to the active component 24 as illustrated by one or more of FIGS. 5A-5C. Furthermore, an element 20A-20C can comprise a monolithically and/or hybrid integrated device design, which forms a single device having a reduced level of intermodulation distortions as compared to a similar device without any compensating components. For example, an element 20A-20C can comprise monolithically and/or hybrid integrated diode-resistor compensating components, which can replace conventional ohmic contacts used to interface with (e.g., inject a signal into) a device channel (e.g., the active component 24).

To this extent, FIGS. 6A and 6B show top and cross section views, respectively, of an illustrative planar (lateral) device 30A having monolithically integrated nonlinearity compensating contacts 32A, 32B according to an embodiment. Similarly, FIGS. 7A and 7B show top and cross section views, respectively, of an illustrative vertical device 30B having monolithically integrated nonlinearity compensating contacts 32A, 32B according to an embodiment. Each contact 32A, 32B is used to interface with a channel 34 of the corresponding device 30A, 30B, and can result in the corresponding device 30A, 30B having a high linearity.

Each contact 32A, 32B comprises a contact area 36 within which are included a set diode cells (pixels) 38. Each diode cell 38 comprises a region within which the contact between the metal electrode 32A, 32B and the semiconductor material of the channel 34 is of a Schottky or p-n junction type. The diode cells 38 can be formed using any solution, e.g., by a metal deposition and selective doping of semiconductor materials solution. The remaining contact area 36 forms an Ohmic or linear resistance contact to the semiconductor material of the channel 34. In an embodiment, a ratio of the total area covered by the set of diode cells 38 to the total area covered by the remaining contact area 36 is selected to obtain a target relation between the diode and resistor I-V characteristics and the I-V characteristics of the channel 34 as described herein. While each contact 32A, 32B is shown including a particular number and configuration of diode cells 38, it is understood that a contact 32A, 32B can have any number and/or configuration of diode cells 38.

Various configurations are possible for the elements described herein. In an embodiment, the active component comprises a transistor, to which at least one compensating component is connected in series with the channel of the transistor (e.g., on the source and/or drain side of the transistor). In this case, the transistor can have a sublinear I-V characteristic and the compensating component(s) can have a superlinear I-V characteristics. Illustrative compensating components with superlinear I-V characteristics include: a Schottky contact; a parallel connection of a Schottky diode and a linear or variable resistor (e.g., as shown in FIGS. 5A-5C); and/or the like. Furthermore, a parallel connection of a Schottky diode and another diode of any type can provide sublinear or superlinear I-V characteristics. Still further, a contact 32A, 32B can have superlinear I-V characteristics.

An embodiment of the element described herein can be implemented as part of various types of devices and/or circuits. Illustrative devices including at least one element according to an embodiment include: a radio frequency (RF) switch); a power switch; an attenuator; a power limiter; an amplifier; and/or the like. Such devices can be incorporated in various types of circuits, such as communication systems. Furthermore, an embodiment of the element described herein can be formed from various materials. In an illustrative embodiment, an element is formed of one or more III-V materials, e.g., a heterostructure. In a more particular illustrative embodiment, the element and/or component is a group III nitride based component, in which one or more layers of the element and/or a component thereof is formed of a group III nitride based material. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

Figure 8:
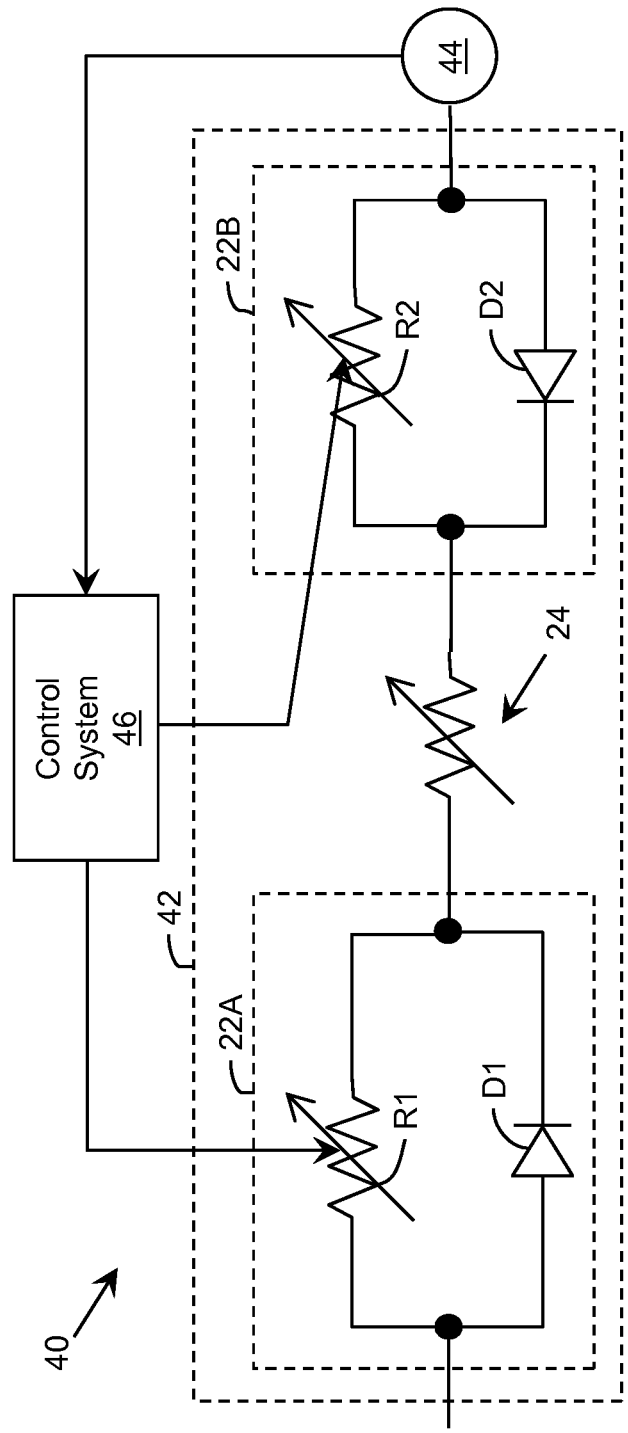
FIG. 8 shows an illustrative feedback and control circuit according to an embodiment.

An embodiment provides a circuit for controlling a level of linearity of a device. To this extent, FIG. 8 shows an illustrative feedback and control circuit 40 according to an embodiment. Circuit 40 is shown including an element 42 comprising an active component 24 and a pair of compensating components 22A, 22B. Each compensating component 22A, 22B can have a variable and controllable nonlinearity. For example, each compensating component 22A, 22B can be configured as shown and described herein with reference to FIG. 5C, where the diodes D1, D2 comprise Schottky diodes and the resistances of R1, R2 are variable. While two compensating components 22A, 22B are shown, it is understood that an embodiment of the circuit 40 can include any number of one or more compensating components 22A, 22B, some or all of which can have a variable and controllable nonlinearity.

Additionally, an output of the element 42 is evaluated by a linearity level measurement unit 44. The linearity level measurement unit 44 can generate data corresponding to the linearity of the output of the element 42 by, for example, performing a standard two-tone measurement technique, extracting linearity coefficients from a measured I-V characteristic, and/or the like. The linearity level measurement unit 44 generates a set of data signals corresponding to a measurement of the linearity (or nonlinearity) of the output of the element 42. The set of data signals is provided for use by a control system 46, which can adjust one or more aspects of the compensating components 22A, 22B affecting the corresponding nonlinearity of the compensating components 22A, 22B in order to achieve a target level of linearity for the element 42 based on the set of data signals. In an embodiment, control system 46 can generate a set of control signals that adjust the resistance values of variable resistors R1 and/or R2 to achieve a target level of linearity for the element 42.

In an embodiment, control system 46 comprises a computer system. In a more particular embodiment, control system 46 comprises a general purpose computer system executing program code, which enables the control system 46 to generate a set of output signals to adjust one or more aspects of the compensating components 22A, 22B based on a set of data signals corresponding to the linearity of the output of the element 42. In an embodiment, the control system 46 can receive a set of data signals from the linearity level measurement unit 44 corresponding to a measured I-V characteristic, and can generate a set of output signals there from. For example, the control system 46 can extract linearity coefficients from the measured I-V characteristic and can generate a set of output signals to implement a set of adjustments as defined by the linearity coefficients, the target level of linearity, and a relationship there between. Furthermore, the control system 46 can enable a user (human or another system) to provide data, such as the target level of linearity, which is used in generating the set of control signals. Similarly, control system 46 can provide data for presentation and/or processing by the user using any solution.

While shown and described herein as a method of designing and/or fabricating a nonlinearity compensated element, it is understood that aspects of the invention further provide various alternative embodiments. For example, in one embodiment, the invention provides a method of designing and/or fabricating a circuit that includes one or more of the nonlinearity compensated elements designed and fabricated as described herein.

Figure 9:
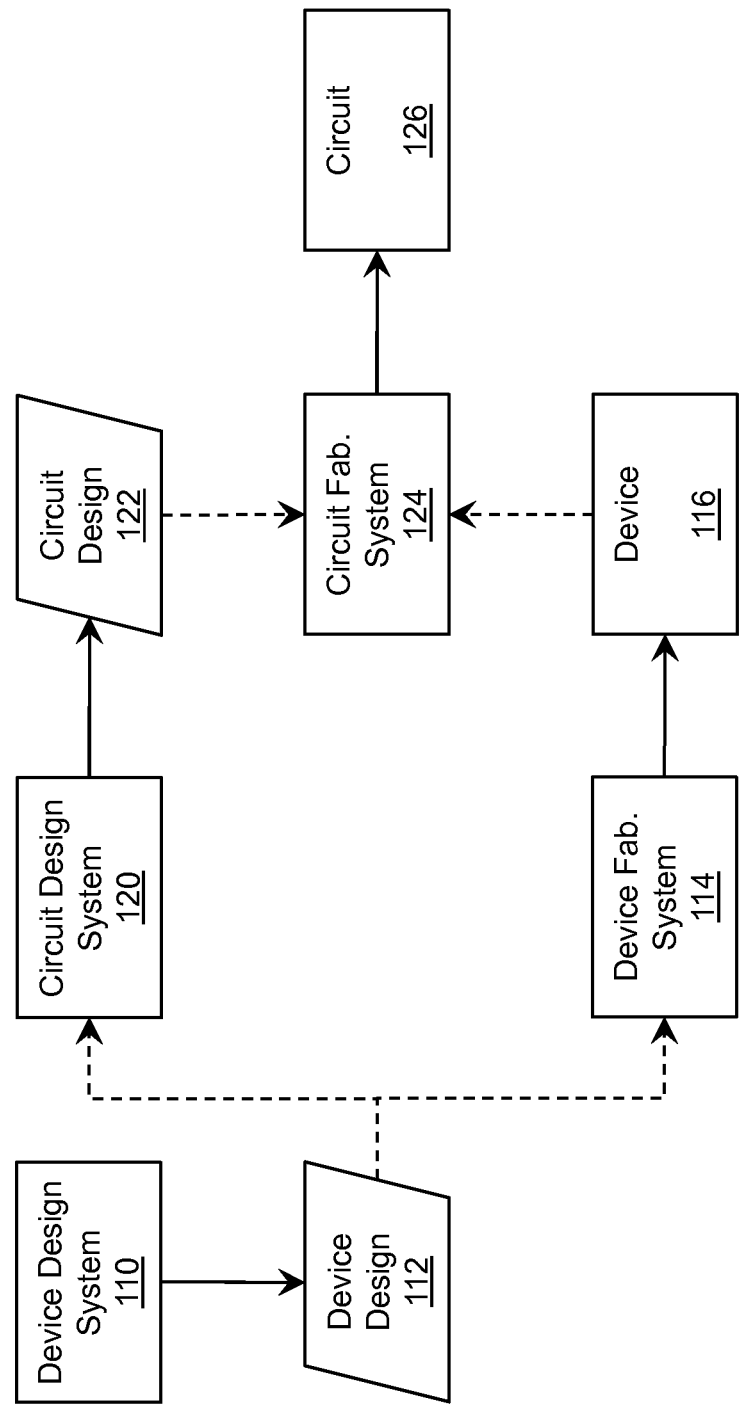
FIG. 9 shows an illustrative flow diagram for fabricating a circuit according to an embodiment.

To this extent, FIG. 9 shows an illustrative flow diagram for fabricating a circuit 126 according to an embodiment. Initially, a user can utilize a device design system 110 to generate a device design 112 for a nonlinearity compensated element as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A circuit element comprising:
   a plurality of connected components, the plurality of connected components including:
      at least one sublinear connected component, each of the at least one sublinear connected component having sublinear current-voltage characteristics; and
      at least one superlinear connected component, each of the at least one superlinear connected component having superlinear current-voltage characteristics, wherein the plurality of connected components are connected such that the current-voltage characteristics of the circuit element produces a level of intermodulation distortion for the circuit element lower than a level of intermodulation distortion for each of the plurality of connected components, and wherein at least one of the at least one superlinear connected component comprises a nonlinearity compensating contact monolithically integrated with at least one of the at least one sublinear connected component.

2. The circuit element of claim 1, wherein at least one of the at least one sublinear connected component comprises a transistor.

3. The circuit element of claim 1, wherein at least one of the at least one superlinear connected component comprises a Schottky contact.

4. The circuit element of claim 1, wherein at least one of the at least one superlinear connected component comprises a Schottky diode connected in parallel with a resistor.

5. The circuit element of claim 1, wherein the plurality of connected components includes a Schottky diode connected in parallel with a second diode.

6. The circuit element of claim 1, the compensating contact comprising:
   a contact area; and
   a set of diode cells within the contact area, each diode cell in the set of diode cells comprising at least one of: a Schottky diode or a p-n junction diode.

7. The circuit of claim 1, wherein the at least one sublinear connected component is directly connected to the at least one superlinear component.

8. A circuit element comprising:
   a plurality of connected components, the plurality of connected components including:
      at least one sublinear connected component, each of the at least one sublinear connected component having sublinear current-voltage characteristics; and
      at least one superlinear connected component, each of the at least one superlinear connected component having superlinear current-voltage characteristics, wherein the plurality of connected components are connected such that the current-voltage characteristics of the circuit element produces a level of intermodulation distortion for the circuit element lower than a level of intermodulation distortion for each of the plurality of connected components, wherein at least one of the at least one superlinear connected component comprises a Schottky diode connected in parallel with a variable resistor.

9. A circuit element comprising:
   a plurality of connected components, the plurality of connected components including:
      at least one sublinear connected component, each of the at least one sublinear connected component having sublinear current-voltage characteristics; and
      at least one superlinear connected component, each of the at least one superlinear connected component having superlinear current-voltage characteristics, wherein the plurality of connected components are connected such that the current-voltage characteristics of the circuit element produces a level of intermodulation distortion for the circuit element lower than a level of intermodulation distortion for each of the plurality of connected components, wherein at least one of the plurality of connected components is a group III nitride based component.

10. A circuit comprising:
    at least one circuit element comprising:
       a plurality of connected components, the plurality of connected components including:
          at least one sublinear connected component, each of the at least one sublinear connected component having sublinear current-voltage characteristics; and
          at least one superlinear connected component, each of the at least one superlinear connected component having superlinear current-voltage characteristics, wherein the plurality of connected components are connected such that the current-voltage characteristics of the circuit element produces a level of intermodulation distortion for the circuit element lower than a level of intermodulation distortion for each of the plurality of connected components;
    a source electrically connected to an input of the at least one circuit element; and
    a load electrically connected to an output of the at least one circuit element, wherein at least one of: the input or the output comprises a nonlinearity compensating contact monolithically integrated with at least one of the at least one superlinear connected component.

11. The circuit of claim 10, wherein the circuit is configured to operate at least one of: a radio frequency switch or a power switch.

12. The circuit of claim 10, wherein the circuit is configured to operate at least one of: an attenuator, a power limiter, or an amplifier.

13. The circuit of claim 10, the compensating contact comprising:
a contact area; and
a set of diode cells within the contact area, each diode cell in the set of diode cells comprising at least one of: a Schottky diode or a p-n junction diode.

14. A circuit comprising:
at least one circuit element comprising:
a plurality of connected components, the plurality of connected components including:
at least one sublinear connected component, each of the at least one sublinear connected component having sublinear current-voltage characteristics; and
at least one superlinear connected component, each of the at least one superlinear connected component having superlinear current-voltage characteristics, wherein the plurality of connected components are connected such that the current-voltage characteristics of the circuit element produces a level of intermodulation distortion for the circuit element lower than a level of intermodulation distortion for each of the plurality of connected components;
a source electrically connected to an input of the at least one circuit element; and
a load electrically connected to an output of the at least one circuit element, wherein at least one of the plurality of connected components comprises a controllable circuit component having a variable and controllable nonlinearity, the circuit further comprising a control component connected to the controllable circuit component, wherein the control component is configured to adjust the nonlinearity of the controllable circuit component based on a target level of linearity for the at least one circuit element.

15. The circuit of claim 14, wherein the controllable circuit component includes a Schottky diode shunted by a variable resistor, and wherein the control component adjusts a resistance of the variable resistor.

16. The circuit of claim 14, further comprising a linearity measurement component connected to an output of the at least one circuit element, wherein the linearity measurement component is configured to generate data corresponding to a linearity measurement of the at least one circuit element, and wherein the control component is further configured to adjust the nonlinearity of the controllable circuit component based on the data corresponding to the linearity measurement of the at least one circuit element.

17. A circuit comprising:
a first circuit element comprising:
an active component; and
a controllable circuit component connected to the active component, wherein the controllable circuit component has a variable and controllable nonlinearity;
a linearity measurement component connected to an output of the first circuit element, wherein the linearity measurement component is configured to generate data corresponding to a linearity measurement of the first circuit element; and
a control component connected to an output of the linearity measurement component and the controllable circuit component, wherein the control component is configured to generate a set of control signals to adjust the nonlinearity of the controllable circuit component based on data received from the linearity measurement component and a target level of linearity for the first circuit element.

18. The circuit of claim 17, wherein the controllable circuit component includes a Schottky diode shunted by a variable resistor, and wherein the set of control signals adjusts a resistance of the variable resistor.

19. The circuit of claim 17, wherein the circuit is configured to operate at least one of: a radio frequency switch or a power switch.

20. The circuit of claim 17, wherein the circuit is configured to operate at least one of: an attenuator, a power limiter, or an amplifier.

* * * * *